United States Patent [19]
Watanabe

[11] Patent Number: 5,710,508
[45] Date of Patent: Jan. 20, 1998

[54] SEMICONDUCTOR APPARATUS

[75] Inventor: Manabu Watanabe, Nagano, Japan

[73] Assignee: Fuji Electric Co., Ltd., Kanagawa, Japan

[21] Appl. No.: 648,405

[22] Filed: May 15, 1996

[30] Foreign Application Priority Data

May 16, 1995 [JP] Japan .................... 7-116775

[51] Int. Cl.$^6$ .................... G05F 1/56; H02H 7/00
[52] U.S. Cl. .................... 323/284; 361/18
[58] Field of Search .................... 323/276, 284, 323/312; 361/18, 87, 89, 94; 363/50

[56] References Cited

U.S. PATENT DOCUMENTS

| | | | |
|---|---|---|---|
| 4,937,697 | 6/1990 | Edwards et al. | 361/18 |
| 5,210,479 | 5/1993 | Kimura et al. | 318/727 |
| 5,444,595 | 8/1995 | Ishikawa | 361/86 |
| 5,548,133 | 8/1996 | Kinzer | 257/155 |
| 5,550,702 | 8/1996 | Schmidt et al. | 361/103 |

FOREIGN PATENT DOCUMENTS 5-327440 of 1993 Japan .

Primary Examiner—Matthew V. Nguyen
Attorney, Agent, or Firm—Pearne, Gordon, McCoy & Granger LLP

[57] ABSTRACT

A semiconductor apparatus includes a driver, an IGBT with a current sensing semiconductor element for controlling ON and OFF of a load current by a driving voltage from the driver, a current detecting section connected to a current sensing terminal of IGBT, for converting a detected current to a total voltage drop and a divided voltage, an overcurrent limiting circuit for reducing the control voltage to a certain value when the total voltage drop exceeds an operating threshold, a protecting circuit connected to the sense terminal, a protecting circuit including an OFF-signal generator circuit for outputting an OFF-signal which commands to stop outputting the control voltage when the total voltage drop exceeds a predetermined operation start voltage, and a delay circuit for delaying the OFF-signal for a certain time period.

5 Claims, 3 Drawing Sheets

SEMICONDUCTOR APPARATUS

BACKGROUND OF THE INVENTION

1. Field of the Invention

The present invention relates to a semiconductor apparatus that includes an intelligent power module such as an insulated gate semiconductor device having a current semiconductor element, a device for limiting an overcurrent, and a device for protecting the semiconductor device against the overcurrent, for use in electronic apparatuses, inverters or the like.

2. Description of the Related Art

FIG. 4 is a block circuit diagram showing a conventional semiconductor apparatus exhibiting overcurrent limiting and protecting functions. Referring to FIG. 4, the conventional semiconductor apparatus has an intelligent power module 10 and a driver 20 including a protecting circuit against overcurrents. The intelligent power module 10 includes an insulated gate bipolar transistor 1 (hereinafter simply referred to as an "IGBT") with an insulated gate bipolar transistor element that senses a current flowing through the IGBT 1 and has a current sensing terminal El; a current detecting section 2, an overcurrent limiting circuit 3, and a gate resistor RG. The driver 20 includes a driver circuit 11, an ON-OFF signal input circuit 12, and a protecting circuit 30 for protecting the IGBT 1 against overcurrents.

During a steady state operation, the driver circuit 11 receives an ON-OFF signal from the ON-OFF signal input circuit 12 and outputs, in response to the ON-OFF signal, a control voltage $V_{11}$. The control voltage $V_{11}$ is converted through the gate resistor $R_G$ to a driving voltage $V_G$, which is then applied between a gate and an emitter of the IGBT 1 to make flow or interrupt a load current $I_L$ between a collector and the emitter of the IGBT 1.

The current detecting section 2 is comprised of a series circuit of resistors $R_1$ and $R_2$ with a voltage divider terminal $D_1$ interposed between the resistors $R_1$ and $R_2$. The current detecting section 2 is connected between the current sensing terminal $E_1$ and the emitter of the IGBT 1. The overcurrent limiting circuit 3 is comprised of a series circuit of an npn transistor 3T, and a voltage regulation diode 3D such as an avalanche diode or a Zener diode.

The overcurrent limiting circuit 3 is connected between the gate and emitter of the IGBT 1. A total voltage drop $V_d$ across the resistors $R_1$, $R_2$ of the current detecting section 2 is applied to a base of the npn transistor 3T.

An overcurrent detecting circuit 31 outputs a detection signal when a divided voltage $V_1$ at the voltage divider terminal $D_1$ (a voltage drop across the resistor $R_1$) exceeds a predetermined operation start voltage $V_{OC}$ of the overcurrent detecting circuit 31. An OFF-signal generator circuit 32 outputs, in response to the detection signal from the overcurrent detecting circuit 31, an OFF-signal that commands the driver circuit 11 to stop outputting therefrom a control voltage $V_{11}$. The protecting circuit 30 is comprised of the overcurrent detecting circuit 31, the OFF-signal generator circuit 32, and an alarm signal generator circuit 33.

In the semiconductor apparatus described above, a short-circuit current flows between the collector and emitter of the IGBT 1 when the load circuit is short-circuited. Then, a sensing current $I_S$ corresponding to the short-circuit current flows via the sensing terminal $E_1$ to the current detecting section 2. The sensing current $I_S$ is detected by the total voltage drop $V_d$ across the resistors $R_1$, $R_2$ and the voltage drop (the divided voltage) $V_1$ across the resistor $R_1$. The total voltage drop $V_d$ applied to the npn transistor 3T is higher than the divided voltage $V_1$ which is represented as follows:

$$V_1 = V_d(R_1/(R_1+R_2)) = KV_d$$

Due to this voltage scheme, when an ON-voltage $V_{Beth}$ of the npn transistor 3T and the operation start voltage $V_{OC}$ of the overcurrent detecting circuit 31 are almost similar to each other, the npn transistor 3T is turned on at first. The turning-on of the npn transistor 3T lowers the driving voltage $V_G$, applied to the gate of the IGBT 1, to a value equivalent to a sum of an avalanche voltage or a Zener voltage of the voltage regulation diode 3D and a forward voltage of the npn transistor 3T to limit the short-circuit current flowing through the IGBT 1. Moreover, when the divided voltage $V_1$ exceeds the operation start voltage $V_{OC}$ of the overcurrent detecting circuit 31, the protecting circuit 30 starts operating, and the driver circuit 11 stops outputting therefrom a control voltage $V_{11}$. Then, the IGBT 1 is turned off, and the short-circuit current is interrupted. By using an alarm signal from the alarm signal generator circuit 33 to break the load circuit, the short-circuit is removed from the load circuit.

As described above, the overcurrent limiting circuit limits the short-circuit current, and the protecting circuit interrupts the limited current within a period of time determined by the load short-circuit withstand capability of the IGBT to prevent the IGBT from breakdown by the load short-circuit.

However, the protecting circuit sometimes fails to work properly in subsequent to the overcurrent limiting circuit, and due to this the IGBT is broken.

In more detail, if we denote the sensing ratio of the IGBT 1 by S, the current flowing through the current detecting section 2 by $I_{S1}$, and the base current of the npn transistor T3 by $I_{S2}$, then the divided voltage $V_1$ necessary to make the protecting circuit operate is expressed as follows.

$$V_1 = R_1(I_{S1}S - I_{S2}) > V_{OC}$$

$R_1$, $I_{S1}$, S, and other such constants are adjusted so that the above-described condition is satisfied. However, it is difficult to adjust these constants, since $I_{S1}$ and S are different from one IGBT to another. Since the relevant constants are not always adjustable appropriately, the protecting circuit sometimes fails to work properly in subsequent to the overcurrent limiting circuit. Especially when the operation start voltage $V_{OC}$ of the overcurrent detecting circuit 31 is lower than the ON-voltage $V_{Beth}$ of the npn transistor 3T, the protecting circuit tends to work improperly in subsequent to the overcurrent limiting circuit. The deviations of $I_{S1}$ and S make it difficult to adjust the timing of interrupting the short-circuit current by the protecting circuit, and may cause breakdown of the IGBT.

When a low level overcurrent is caused during the steady state operation, the overcurrent limiting circuit 3 lowers the driving voltage $V_G$ to reduce the overcurrent flowing through the IGBT 1. By thus limiting the overcurrent flowing through the IGBT 1, the IGBT 1 is protected against the overcurrent. The limited overcurrent is interrupted when an input signal to the input circuit 12 changes its level to low one. In association with this, the overcurrent limiting circuit 3 stops operating. However, when the input signal to the input circuit 12 resumes its high level, the overcurrent flows again, and overcurrent limiting circuit 3 operates again to limit the overcurrent. The overcurrent limiting circuit 3 starts and stops operating repeatedly. Due to this repeated start and stop cycles, the steady state loss of the IGBT increases. The heat accumulated by the steady state loss increase causes breakdown of the IGBT 1, even though the IGBT 1 is provided with the overcurrent limiting circuit 3.

SUMMARY OF THE INVENTION

The present invention has been made in view of the above circumstances, and therefore an object of the present invention is to provide a semiconductor apparatus exhibiting an excellent performance by which the insulated gate semiconductor device is securely protected against any overcurrent irrespective of whether the overcurrent is caused by a load short-circuit or during the steady state operation.

In order to solve the above problem, the present invention has been achieved by the provision of a semiconductor apparatus which includes a driving means for outputting a driving voltage; an insulated gate semiconductor device having a semiconductor element for current sensing, the semiconductor device controlling ON and OFF of a load current in response to the driving voltage; a current detecting means for converting a current detected by the current sensing semiconductor element to a total voltage drop and a divided voltage, the current detecting means being connected to the semiconductor element's sensing terminal; an overcurrent limiting means for reducing the driving voltage to a certain value when the divided voltage exceeds a predetermined operating voltage of the overcurrent limiting means; a protecting means for protecting the semiconductor device against overcurrents, the protecting means being connected to the sensing terminal of the semiconductor element, the protecting means including an OFF-signal generating means for outputting an OFF-signal when the total voltage drop exceeds a predetermined operation start voltage of the protecting means, the OFF-signal commanding the driving means to stop outputting the driving voltage; and the protecting means including a delay means for delaying the OFF-signal from the OFF-signal generating means for a certain time period.

Advantageously, the operating voltage of the overcurrent limiting means is set at a higher value than the operation start voltage of the protecting means.

It is preferable for an OFF-signal delayed by the delaying means to stop output of the driving voltage from the driving means within a permissible time determined by the load short-circuit withstand capability of the insulated gate semiconductor element.

Since the overcurrent limiting means is driven by the divided voltage of the current detecting means without any delay, the overcurrent limiting means responds quickly to an overcurrent, though its overcurrent detection sensitivity is low. Since the protecting means is driven by the total voltage drop across the current detecting means, the overcurrent detection sensitivity of the protecting means is high. The protecting means responds slowly to an overcurrent, since the OFF-signal is delayed by the delaying means.

Therefore, the overcurrent limiting means responds at first to a quickly rising short-circuit current to limit the short-circuit current flowing through the insulated gate semiconductor device. Afterwards, the OFF-signal from the protecting means reaches the driving means. The driving means stops outputting the driving voltage to securely interrupt the already limited short-circuit current.

The protecting means responds to a slowly rising ordinary overcurrent before the overcurrent limiting means limits the slowly rising ordinary overcurrent. The delayed OFF-signal from the protecting means reaches the driving means to interrupt the ordinary overcurrent before the divided voltage of the current detecting means reaches the operation start voltage of the overcurrent limiting means. This protection mode avoids the drawback of the prior art, i.e. the repeated overcurrent limiting operations repeated every time when the driving voltage reaches a high level.

By setting the operating voltage of the overcurrent limiting means at a value higher than the operation start voltage of the protecting means, a difference between the overcurrent detection sensitivities of the overcurrent limiting means and the protecting mean is expanded by a multiplier effect with the voltage divide ratio of the current detecting means. By effectively utilizing the sensitivity and response speed differences, the semiconductor device is protected securely against the short-circuit current and ordinary overcurrent.

By setting the time constant of the delaying means such that the output of the driving voltage from the driving means is stopped within a permissible time determined by the load short-circuit withstand capability of the insulated gate semiconductor device, the insulated gate semiconductor device is prevented easily and securely from breakdown by the load short-circuit.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Figure 4:
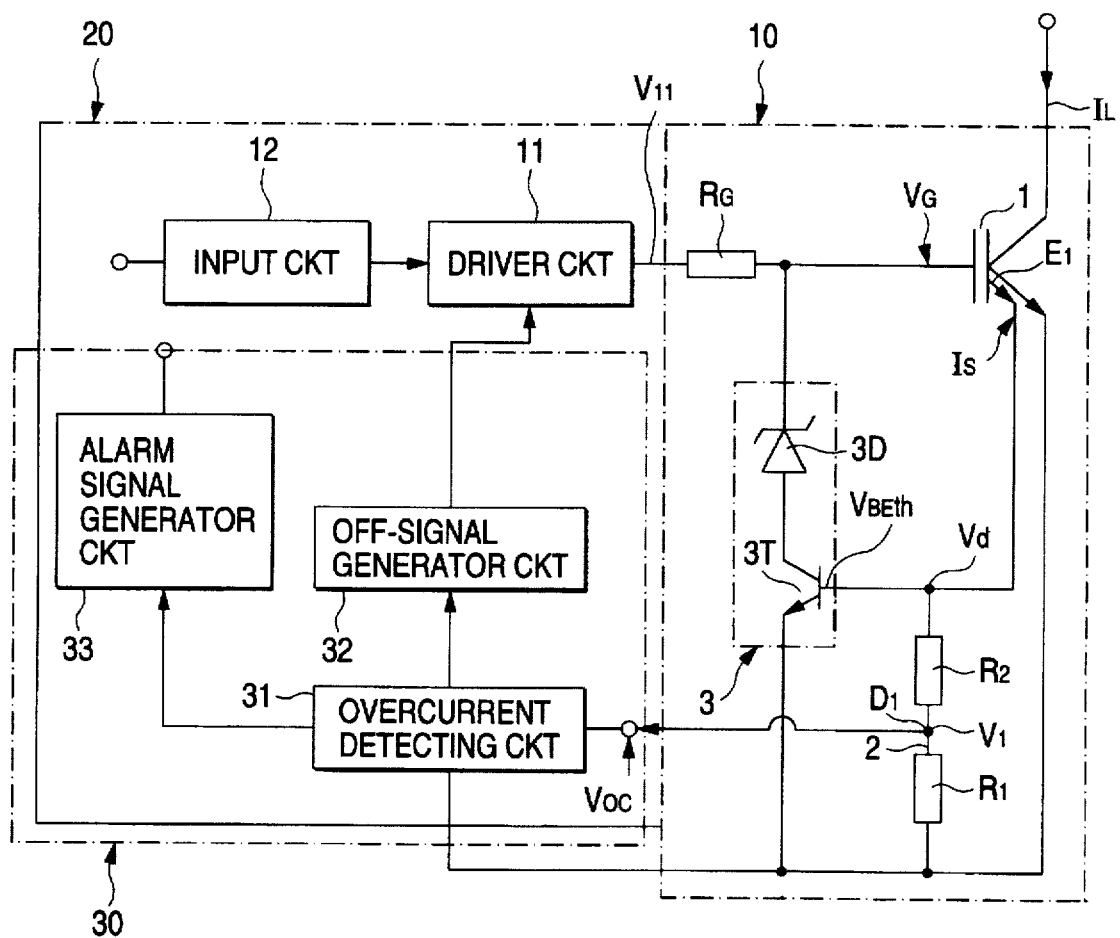
FIG. 4 is a block circuit diagram showing a conventional semiconductor apparatus exhibiting overcurrent limiting and protecting functions.

Now, the present invention will be described in detail hereinafter with reference to the accompanied drawings that illustrate a preferred embodiment of the present invention. In these drawings, like parts with those of FIG. 4 are designated by like numerals or symbols, and their explanations are omitted for the sake of simplicity.

Figure 1:
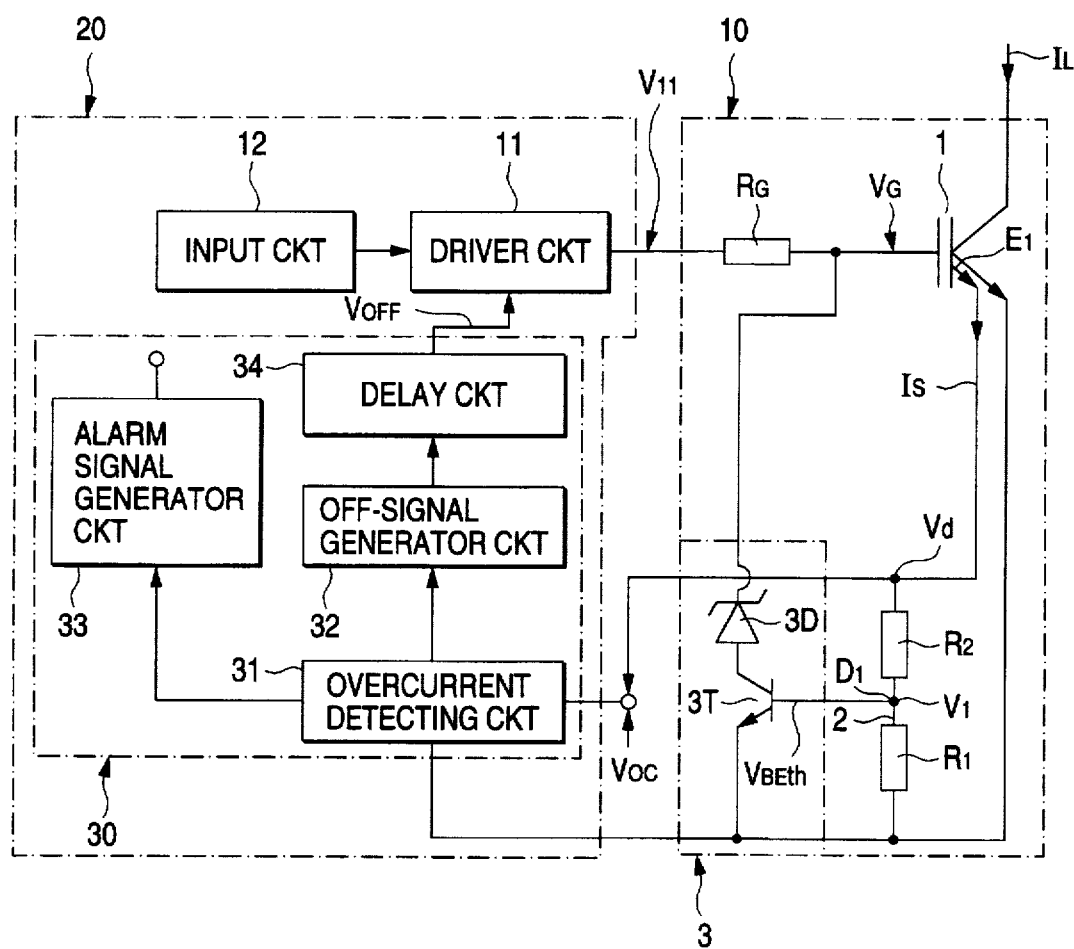
FIG. 1 is a circuit block diagram showing a semiconductor apparatus according to an embodiment of the present invention.

FIG. 1 is a circuit block diagram showing a semiconductor apparatus according to an embodiment of the present invention. Referring to FIG. 1, this semiconductor apparatus has an intelligent power module 10 and a driver 20 including a protecting circuit against overcurrents, as in the conventional example shown in FIG. 4. The intelligent power module 10 includes an IGBT 1 with an insulated gate semiconductor element that senses current and has a sensing terminal $E_1$, a current detecting section 2, an overcurrent limiting circuit 3, and a gate resistor $R_G$. The driver 20 includes a driver circuit 11, an ON-OFF signal input circuit 12, and an overcurrent protecting circuit 30.

The current detecting section 2 is comprised of a series circuit of resistors $R_1$ and $R_2$ with a voltage divider terminal $D_1$ interposed between the resistors $R_1$ and $R_2$. The current detecting section 2 is connected between the current sensing terminal $E_1$ and the emitter of the IGBT 1. The semiconductor device shown FIG. 1 differs from the conventional semiconductor device shown FIG. 4 in that the voltage divider terminal $D_1$ of the current detecting section 2 is connected to a base of an npn transistor $T_3$ of the overcurrent limiting circuit 3 such that, when a divided voltage $V_1$ (voltage drop across the resistor $R_1$) exceeds an operation voltage $V_{BEth}$ of the npn transistor $T_3$, the npn transistor $T_3$ is turned on to reduce a driving voltage $V_G$ of the IGBT 1 to a certain value which is almost determined by a reverse conducting voltage of a voltage regulation diode 3D.

The protecting circuit 30 includes an overcurrent detecting circuit 31, an OFF-signal generator circuit 32, and an alarm signal generator circuit-33. The protecting circuit 30 includes also a delay circuit 34 connected to the output side of the OFF-signal generator circuit 32.

The protecting circuit 30 is connected to the current sensing terminal $E_1$ of the IGBT 1. A total voltage drop $V_d$ (voltage drop across the resistors $R_1$, $R_2$) of the current detecting section 2 is compared with a predetermined operation start voltage $V_{OC}$ in the overcurrent detecting circuit 31 which comprises, for example, a comparator circuit. The delay circuit 34 delays an OFF-signal from the OFF-signal generator circuit 32 for a certain delay time τ and outputs the delayed OFF-signal to the driver circuit 11. The driver circuit 11 stops outputting a control voltage V11 in response to the OFF-signal input.

Figure 2:
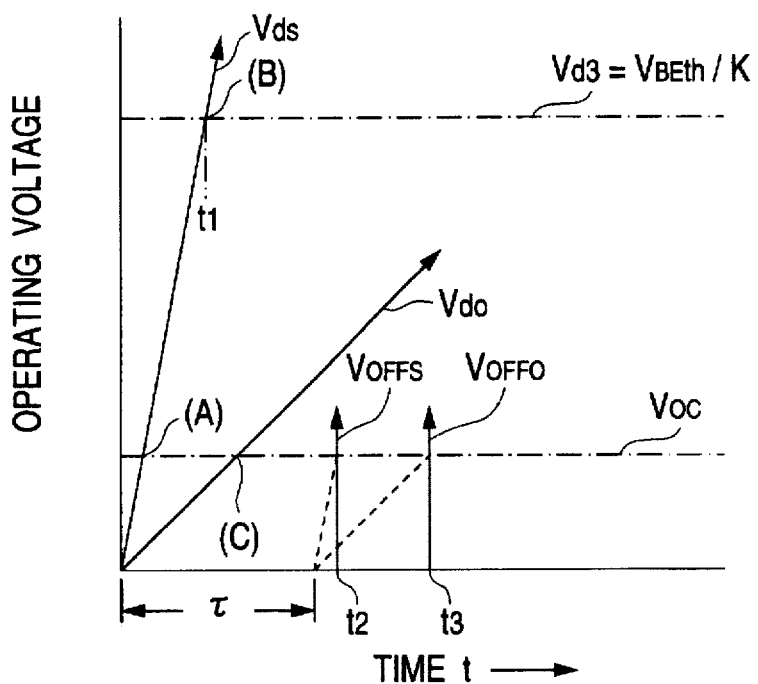
FIG. 2 is a set of characteristic curves schematically illustrating the operation of the semiconductor apparatus of FIG. 1.

FIG. 2 is a set of characteristic curves schematically illustrating the overcurrent protection of this embodiment. In the figure, the operating voltage $V_{BEth}$ of the current limiting circuit 3 is replaced by a total voltage drop $V_{d3}$ necessary to turn on the npn transistor 3T. $V_{d3}$ is obtained by dividing the operating voltage $V_{BEth}$ by the voltage divide ratio $K=R_1/(R_1+R_2)$ of the current detecting section 2. FIG. 2 shows an example in which $V_{d3}$ is set at 2 $V_{OC}$ and K at 0.5. By the adjustment of the constants, the overcurrent limiting circuit 3 exhibits a low overcurrent detection sensitivity but a quick overcurrent limiting response. On the other hand, the protecting circuit 30 exhibits a high overcurrent detection sensitivity but a slow protecting response, since the protecting circuit 30 delays the OFF-signal output for the delay time τ. By utilizing the differences of the protection characteristics of these circuits, the following protection operation will be facilitated.

When a short-circuit current is caused by a load short-circuit or such a cause, the current detecting section 2 detects the short-circuit current and outputs a total voltage drop $V_{ds}$, which is quickly changing. As soon as the quickly changing total voltage drop $V_{ds}$, exceeds the operation start voltage $V_{OC}$ of the overcurrent detecting circuit 31 at a point "A", the OFF-signal generator circuit 32 outputs an OFF-signal. Then, the total voltage drop $V_{ds}$, exceeds at a point "B" the total voltage drop $V_{d3}$ at which the npn transistor 3T operates, and reaches $V_{BEth}$ of the npn transistor 3T. At a time $t_1$, the overcurrent limiting circuit 3 operates to lower the driving voltage $V_G$.

The OFF-signal is delayed for a delay time τ by the delay circuit 34, which outputs at a time $t_2$ the delayed OFF-signal $V_{OFFS}$ to the driver circuit 11. The driver circuit 11 stops output of the control voltage $V_{11}$ in response to the input of the delayed OFF-signal $V_{OFFS}$. Thus, by adjusting the voltage divide ratio of the current detecting section 2 and the delay time of the delay circuit 34, the overcurrent limiting circuit 3 and the protecting circuit 30 securely operate one after the other in the order of this description to protect the IGBT 1 against the short-circuit current.

The IGBT 1 is protected against a slowly changing ordinary overcurrent in the following manner. The current detecting section 2, which has detected the ordinary overcurrent, outputs a total voltage drop $V_{do}$ which is slowly changing. As soon as the slowly changing total voltage drop $V_{do}$ exceeds the operation start voltage $V_{OC}$ of the overcurrent detecting circuit 31 at a point "C", the OFF-signal generator circuit 32 outputs an OFF-signal. A delayed OFF-signal $V_{OFFO}$ delayed for a delay time τ by the delay circuit 34 is outputted at a time ts to the driver circuit 11 before the slowly changing total voltage drop $V_{Do}$ reaches $V_{d3}$ necessary to operate the npn transistor 3T. The driver circuit 11 stops output of the control voltage $V_{11}$ in response to the input of the delayed OFF-signal $V_{OFFO}$ to interrupt the overcurrent flowing through the IGBT 1. When a quickly rising low level overcurrent is caused, the semiconductor device is protected in the similar manner as described above except for a little bit earlier output of the delayed OFF-signal $V_{OFFO}$.

Figure 3:
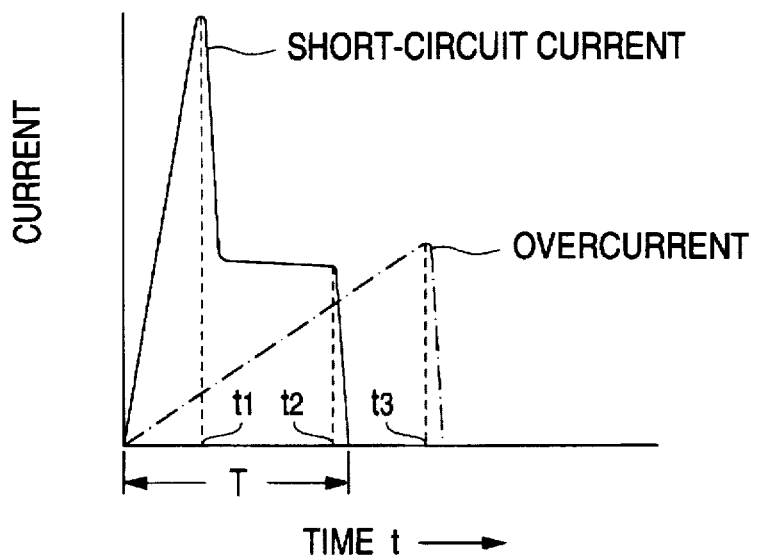
FIG. 3 is an overcurrent wave chart obtained by the operation of the semiconductor apparatus of FIG. 1.

FIG. 3 is an overcurrent wave chart obtained by the protection operation of the semiconductor apparatus of FIG. 1. In the figure, a short-circuit current is limited at the time $t_1$ when the overcurrent limiting circuit 3 operates, and interrupted at the time $t_2$ when the control voltage $V_{11}$ is stopped by the protecting circuit 30. Therefore, by setting the time constant of the delay circuit 34 such that the short-circuit current is interrupted within a permissible time determined by the short-circuit withstand capability of the IGBT 1, the IGBT 1 is prevented from breakdown by the load short-circuit.

The slowly changing low level overcurrent increases gradually without being limited until it is interrupted at the time $t_3$ when the delayed OFF-signal $V_{OFFO}$ is outputted. Therefore, by making the OFF-signal generator circuit 32, which is made up of a logic circuit, latch the OFF-signal or by providing the driver circuit 11 with a means which keeps stopping the control voltage $V_{11}$, the abnormal state, which repeats generation and limitation or interruption of the overcurrent every time when the level of control voltage $V_{11}$ becomes high, is avoided. Thus, the IGBT is prevented from loss increase and breakdown.

Though the present invention has been explained by way of an IGBT as an insulated gate semiconductor device having therein an insulated gate semiconductor element for current sensing, it is obvious to one skilled in the art that the present invention is applicable to the other insulated gate semiconductor devices such as power MOSFET's having therein a current sensing MOSFET.

As described above, the semiconductor apparatus of the invention has an overcurrent limiting circuit which is of low overcurrent detection sensitivity but quick in overcurrent limiting response, and a protecting circuit which is of high overcurrent detection sensitivity but slow in protecting response due to a delay circuit provided thereto. By virtue of this structure, the overcurrent limiting circuit functions at first to limit a short-circuit current caused by a load short-circuit, and then the protecting circuit securely functions to interrupt the short-circuit current. Thus, the drawback of the conventional semiconductor apparatus, that is the unstable performance of its protecting circuit with a low overcurrent detection sensitivity, is avoided. Therefore, the semiconductor apparatus of the invention is provided with a protection function which securely protects its insulated gate semiconductor device against a load short-circuit.

The protecting circuit of the present semiconductor apparatus functions in advance to the overcurrent limiting circuit to interrupt a low-level ordinary overcurrent. This protection scheme of the invention obviates the drawback of the prior art that overcurrent generation and limitation are repeated every time when an input signal to the driver circuit of the semiconductor device reaches a high level. Therefore, the semiconductor apparatus of the invention is provided with a protection function that securely protects its insulated gate semiconductor device against an ordinary overcurrent without causing loss increase of the semiconductor device.

The overcurrent detection sensitivities and operation timings of the overcurrent limiting circuit and the protecting circuit can be adjusted easily and securely by setting the voltage divide ratio of the current detecting section and the delay time of the delay circuit. Therefore, negative effects of deviations of the current sensing ratio and the current limit value are avoided and a stable overcurrent protection is facilitated.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor apparatus, comprising:

driving means for outputting a driving voltage;

an insulated gate semiconductor device including a semiconductor element for current sensing with a sense terminal, for controlling ON and OFF of a load current according to said driving voltage;

current detecting means connected to the sense terminal of said semiconductor element, for converting a current detected by said semiconductor element into a total voltage drop and a divided voltage;

overcurrent limiting means for reducing said driving voltage to a predetermined value when said divided voltage exceeds a predetermined operating voltage of said overcurrent limiting means; and protecting means for protecting said insulated gate semiconductor device against overcurrents, said protecting means being connected to the sensing terminal of said semiconductor element;

wherein said protecting means including overcurrent detecting means for comparing the total voltage drop from said current detecting means with a predetermined operation start voltage of said protecting means to detect overcurrents, OFF-signal generating means for outputting an OFF-signal when said overcurrent detecting means detects that the total voltage drop exceeds the predetermined operation start voltage, the OFF-signal commanding said driving means to stop outputting the driving voltage, and delay means for delaying the OFF-signal from said OFF-signal generating means for a predetermined period of time.

2. A semiconductor apparatus according to claim 1, wherein the operating voltage of said overcurrent limiting means is set to be higher than the operation start voltage of said protecting means.

3. A semiconductor apparatus according to claim 1, wherein the OFF-signal delayed by said delaying means stops output of the driving voltage from said driving means within a permissible time determined by a load short-circuit withstand capacity of said insulated gate semiconductor device.

4. A semiconductor apparatus according to claim 2, wherein the OFF-signal delayed by said delaying means stops output of the driving voltage from said driving means within a permissible time determined by a load short-circuit withstand capacity of said insulated gate semiconductor device.

5. A semiconductor apparatus according to claim 1, further comprising an alarm signal generator circuit for generating an alarm signal when said overcurrent detecting means detects that the total voltage drop exceeds the predetermined operation start voltage.

* * * * *